United States Patent
Nanba (10) Patent No.: US 10,431,448 B2
(45) Date of Patent: Oct. 1, 2019

(54) WET ETCHING METHOD, SUBSTRATE LIQUID PROCESSING APPARATUS, AND STORAGE MEDIUM

(71) Applicant: Tokyo Electron Limited, Tokyo (JP)

(72) Inventor: Hiromitsu Nanba, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 207 days.

(21) Appl. No.: 15/545,347

(22) PCT Filed: Jan. 25, 2016

(86) PCT No.: PCT/JP2016/052042
§ 371 (c)(1),
(2) Date: Jul. 21, 2017

(87) PCT Pub. No.: WO2016/121704
PCT Pub. Date: Aug. 4, 2016

(65) Prior Publication Data
US 2018/0012754 A1    Jan. 11, 2018

(30) Foreign Application Priority Data
Jan. 28, 2015   (JP) .................................. 2015-014764

(51) Int. Cl.
*H01L 21/02* (2006.01)
*H01L 21/67* (2006.01)
*H01L 21/687* (2006.01)
*H01L 21/306* (2006.01)
*H01L 21/3213* (2006.01)

(52) U.S. Cl.
CPC .. *H01L 21/02087* (2013.01); *H01L 21/30604* (2013.01); *H01L 21/32134* (2013.01); *H01L 21/6708* (2013.01); *H01L 21/67051* (2013.01); *H01L 21/68764* (2013.01)

(58) Field of Classification Search
CPC combination set(s) only.
See application file for complete search history.

(56) References Cited

U.S. PATENT DOCUMENTS

2011/0240067 A1* 10/2011 Kishimoto ........ H01L 21/02087
134/33

FOREIGN PATENT DOCUMENTS

JP   2008-047629 A   2/2008

OTHER PUBLICATIONS

International Search Report dated Mar. 8, 2016 for WO 2016/121704 A1.

* cited by examiner

*Primary Examiner* — Erin F Bergner
(74) *Attorney, Agent, or Firm* — Abelman, Frayne & Schwab (57) ABSTRACT

A wet etching method according to the present disclosure includes rotating a substrate, supplying an etching chemical liquid to a first surface (a surface on which a device is formed) of the rotating substrate, and supplying an etching inhibiting liquid (DIW) to a second surface (a surface on which no device is formed) of the substrate while supplying the chemical liquid to the substrate. The etching inhibiting liquid wraps around the first surface through an edge of the substrate and reaches a first region extending from the edge of the substrate on the peripheral edge portion of the first surface to a first radial position located radially inward from the edge on the first surface. As a result, bevel etching of an upper layer of a substrate on which a film having two layers is formed may be satisfactorily performed.

8 Claims, 6 Drawing Sheets

WET ETCHING METHOD, SUBSTRATE LIQUID PROCESSING APPARATUS, AND STORAGE MEDIUM

CROSS REFERENCE TO RELATED APPLICATIONS

This application is a national phase of PCT application No. PCT/JP2016/052042, filed on Jan. 25, 2016, which claims priority from Japanese patent application No. 2015-014764, filed on Jan. 28, 2015, all of which are incorporated herein by reference.

TECHNICAL FIELD

The present disclosure relates to a technology that etches a peripheral edge portion of a substrate on which a plurality of films are laminated.

BACKGROUND

A process of manufacturing a semiconductor device includes a process of removing only a peripheral edge portion of a film formed on the surface of a substrate (e.g., a semiconductor wafer) by wet etching, and this process is called bevel etching. In Japanese Patent Laid-Open Publication No. 2008-47629 ("Patent Document 1"), the bevel etching is performed by supplying an etching liquid to the peripheral edge portion of the surface of the substrate on which a film having one layer is formed. When a film having two (or more) layers is formed on the substrate to be subjected to the bevel etching, it may be requested to remove only the upper layer film while leaving the lower layer film. In this case, when a chemical liquid having a high etching selection ratio of the upper layer to the lower layer does not exist, it is difficult to implement the request.

Figure 4A:
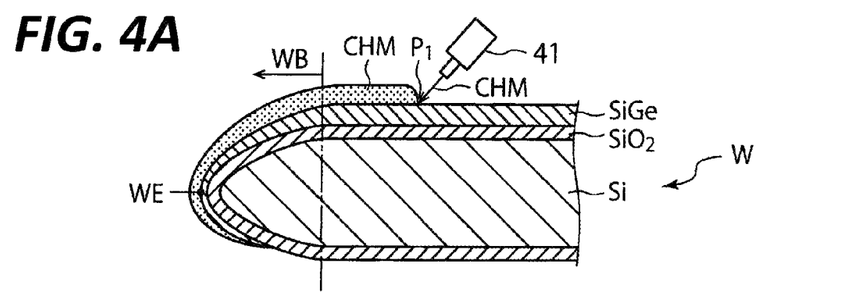
FIGS. 4A to 4D are explanatory views illustrating an operation of the first exemplary embodiment of the wet etching method.

For example, in an Si substrate on which an SiGe film as an upper layer is formed on an $SiO_2$ film as a lower layer by a single-wafer CVD apparatus, the film thickness of the SiGe film in the vicinity of the edge of the substrate tends to be thin (see, e.g., FIG. 4A). Hence, at the wet etching time, the SiGe film in the vicinity of the edge is lost early, and the $SiO_2$ film is exposed. When the etching is continued until the SiGe film is completely removed from the entire peripheral edge portion of the substrate, the $SiO_2$ film in the vicinity of the edge is lost, and Si as a base may be exposed.

Figures 6A, 6B:
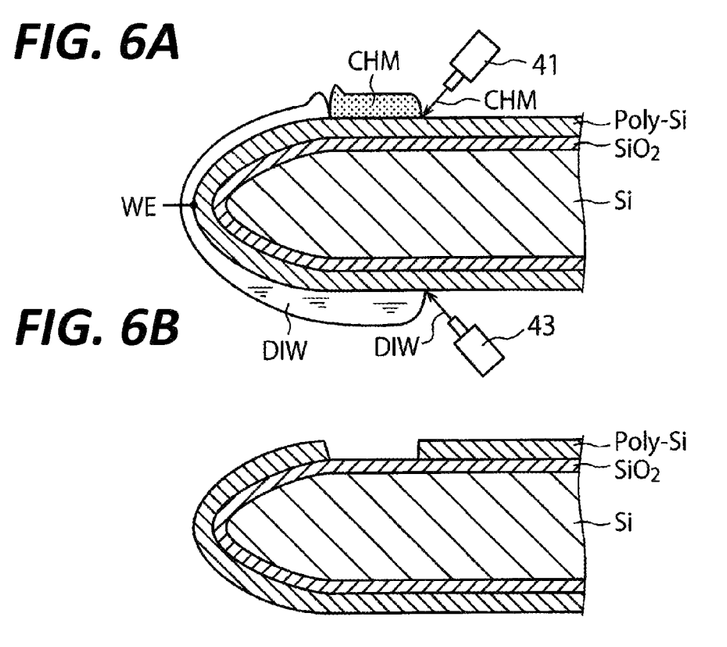
FIGS. 6A to 6D are explanatory views illustrating an operation of the second exemplary embodiment of the wet etching method.
Figure 6C:
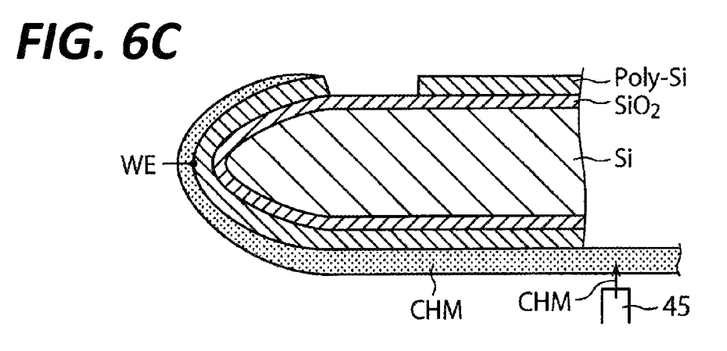

In addition, for example, in an Si substrate on which a poly-Si film as an upper layer is formed on an $SiO_2$ film as a lower layer by a batch type film forming apparatus, the poly-Si film is formed on the entire surface of the substrate with a substantially uniform film thickness (see, e.g., FIG. 6A). In this substrate, the poly-Si film on the peripheral edge portion of the front surface and the entire rear surface of the substrate is removed. At this time, the poly-Si film in the vicinity of the edge which is etched by both a chemical liquid supplied for etching of the peripheral edge portion of the front surface and a chemical liquid supplied for etching of the rear surface may be lost early, and the $SiO_2$ film as a base may also be lost.

PRIOR ART DOCUMENT

Patent Document

Patent Document 1: Japanese Patent Laid-Open Publication No. 2008-047629

DISCLOSURE OF THE INVENTION

Problems to be Solved

An object of the present disclosure is to provide a technology capable of satisfactorily performing bevel etching of an upper layer of a substrate on which a film having two layers is formed.

Means to Solve the Problems

An exemplary embodiment of the present disclosure provides a wet etching method for wet-etching a substrate including a first surface and a second surface opposite to the first surface and formed with a first layer as a lower layer and a second layer as an upper layer that are laminated on at least a peripheral edge portion of the first surface of the substrate, the method including: a process of rotating the substrate; a process of supplying a chemical liquid capable of etching both the first layer and the second layer, to the first surface of the rotating substrate; and a first process of supplying an etching inhibiting liquid to the second surface of the substrate while supplying the chemical liquid to the substrate; wherein in the first process, the etching inhibiting liquid is supplied while rotating the substrate such that the etching inhibiting liquid wraps around the first surface through an edge of the substrate and reaches a first region extending from the edge of the substrate on the peripheral edge portion of the first surface to a first radial position located radially inward from the edge on the first surface.

Another exemplary embodiment of the present disclosure provides a non-transitory computer-readable storage medium storing a program that, when executed by a computer that controls an operation of a substrate processing apparatus, causes the computer to control the substrate processing apparatus so as to execute the above-described wet etching method.

Still another exemplary embodiment of the present disclosure provides a substrate liquid processing apparatus for wet-etching a substrate including a first surface and a second surface opposite to the first surface and formed with a first layer as a lower layer and a second layer as an upper layer that are laminated on at least a peripheral edge portion of the first surface of the substrate, the apparatus including: a substrate holding unit that holds the substrate in a horizontal posture and rotates the substrate around a vertical axis; a chemical liquid nozzle that supplies a chemical liquid capable of etching both the first layer and the second layer to a peripheral edge portion of the first surface; an etching inhibiting liquid nozzle that supplies an etching inhibiting liquid to the second surface of the substrate; and a control device that controls at least the rotation of the substrate by the substrate holding unit and a flow rate of the etching inhibiting liquid supplied from the etching inhibiting nozzle, wherein when the chemical liquid nozzle supplies the chemical liquid to the peripheral edge portion of the first surface of the substrate, the control device supplies the etching inhibiting liquid to the second surface of the substrate by the etching inhibiting liquid nozzle while rotating the substrate such that the supplied etching inhibiting liquid wraps around the first surface through an edge of the substrate reaches a first region extending from the edge of the substrate on the peripheral edge portion of the first surface to a first radial position located radially inward from the edge on the first surface.

Effect of the Invention

According to the present disclosure, the bevel etching of an upper layer of a substrate on which a film having two layers is formed may be satisfactorily performed.

DETAILED DESCRIPTION TO EXECUTE THE INVENTION

Hereinafter, exemplary embodiments of the present disclosure will be described with reference to the accompanying drawings.

Figure 1:
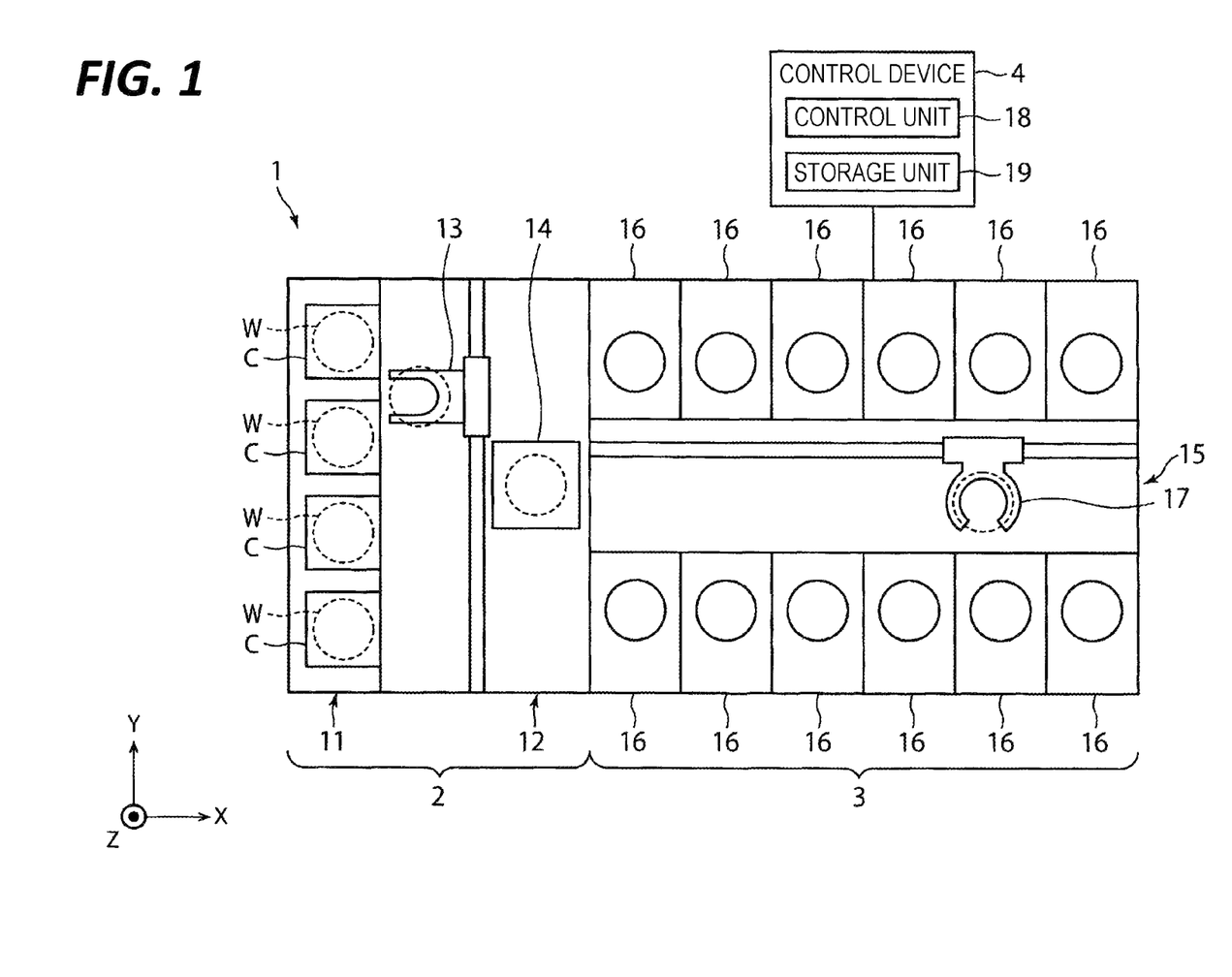
FIG. 1 is a plan view illustrating an outline of a substrate processing system according to an exemplary embodiment of the present disclosure.

FIG. 1 is a view illustrating an outline of a substrate processing system according to an exemplary embodiment of the present disclosure. In the following, in order to clarify positional relationships, the X-axis, Y-axis and Z-axis which are orthogonal to each other will be defined. The positive Z-axis direction will be regarded as a vertically upward direction.

As illustrated in FIG. 1, a substrate processing system 1 includes a carry-in/out station 2 and a processing station 3. The carry-in/out station 2 and a processing station 3 are provided adjacent to each other.

The carry-in/out station 2 is provided with a carrier placing section 11 and a transfer section 12. In the carrier placing section 11, a plurality of carriers C is placed to accommodate a plurality of substrates (semiconductor wafers in the present exemplary embodiment) (hereinafter, referred to as "wafers W") horizontally.

The transfer section 12 is provided adjacent to the carrier placing section 11, and provided with a substrate transfer device 13 and a delivery unit 14. The substrate transfer device 13 is provided with a wafer holding mechanism configured to hold the wafer W. Further, the substrate transfer device 13 is movable horizontally and vertically and pivotable around a vertical axis, and transfers the wafers W between the carriers C and the delivery unit 14 by using the wafer holding mechanism.

The processing station 3 is provided adjacent to the transfer section 12. The processing station 3 is provided with a transfer section 15 and a plurality of processing units 16. The plurality of processing units 16 is arranged at both sides of the transfer section 15.

The transfer section 15 is provided with a substrate transfer device 17 therein. The substrate transfer device 17 is provided with a wafer holding mechanism configured to hold the wafer W. Further, the substrate transfer device 17 is movable horizontally and vertically and pivotable around a vertical axis. The substrate transfer device 17 transfers the wafers W between the delivery unit 14 and the processing units 16 by using the wafer holding mechanism.

The processing units 16 perform a predetermined substrate processing on the wafers W transferred by the substrate transfer device 17.

Further, the liquid processing system 1 is provided with a control device 4. The control device 4 is, for example, a computer, and includes a control unit 18 and a storage unit 19. The storage unit 19 stores a program that controls various processings performed in the liquid processing system 1. The control unit 18 controls the operations of the liquid processing system 1 by reading and executing the program stored in the storage unit 19.

Further, the program may be recorded in a computer-readable recording medium, and installed from the recording medium to the storage unit 19 of the control device 4. The computer-readable recording medium may be, for example, a hard disc (HD), a flexible disc (FD), a compact disc (CD), a magnet optical disc (MO), or a memory card.

In the substrate processing system 1 configured as described above, the substrate transfer device 13 of the carry-in/out station 2 first takes out a wafer W from a carrier C placed in the carrier placing section 11, and then places the taken wafer W on the transfer unit 14. The wafer W placed on the transfer unit 14 is taken out from the transfer unit 14 by the substrate transfer device 17 of the processing station 3 and carried into a processing unit 16.

The wafer W carried into the processing unit 16 is processed by the processing unit 16, and then, carried out from the processing unit 16 and placed on the delivery unit 14 by the substrate transfer device 17. After the processing of placing the wafer W on the delivery unit 14, the wafer W returns to the carrier C of the carrier placing section 11 by the substrate transfer device 13.

Figure 2:
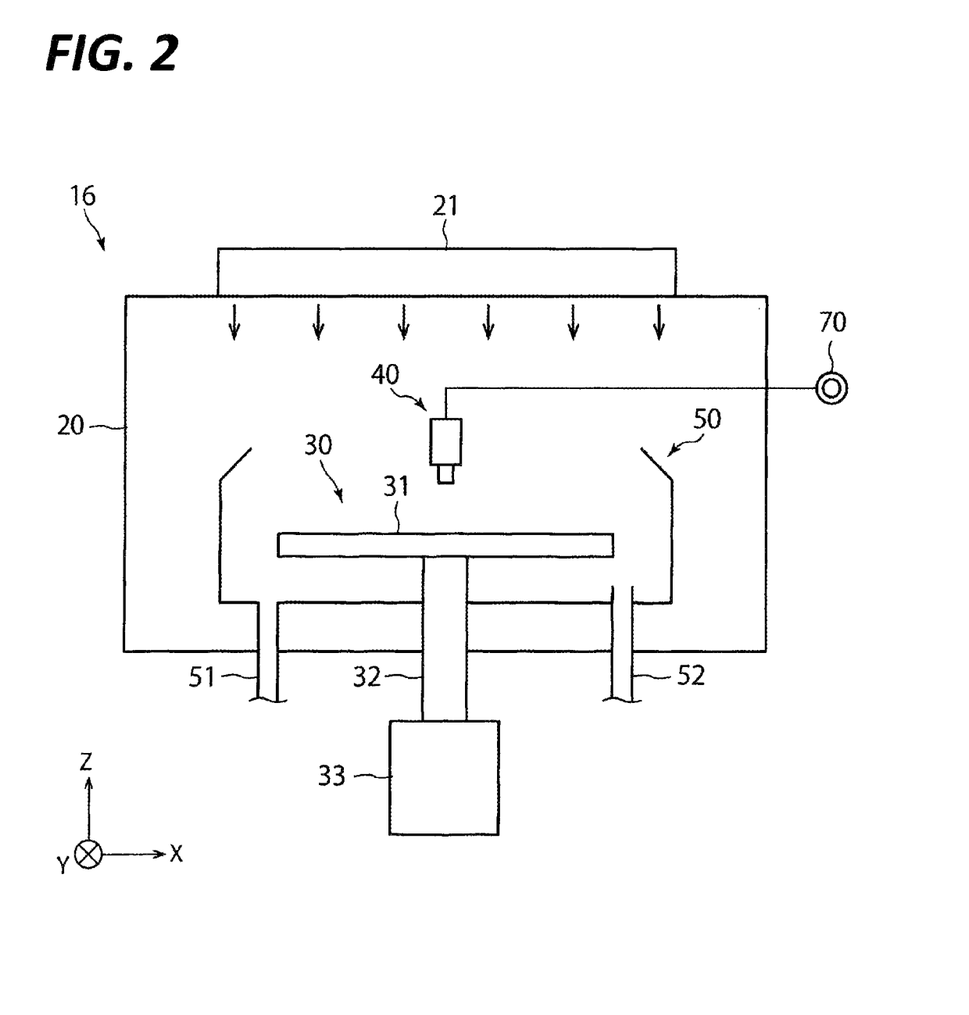
FIG. 2 is a vertical cross-sectional view illustrating an outline of a processing unit.

Next, an outline of the processing unit 16 will be described with reference to FIG. 2. FIG. 2 is a view illustrating an outline of the processing unit 16.

As illustrated in FIG. 2, the processing unit 16 is provided with a chamber 20, a substrate holding mechanism 30, a processing fluid supply unit 40, and a recovery cup 50.

The chamber 20 accommodates the substrate holding mechanism 30, the processing fluid supply unit 40, and the recovery cup 50. A fan filter unit (FFU) 21 is provided on the ceiling of the chamber 20. The FFU 21 forms a downflow in the chamber 20.

The substrate holding mechanism 30 is provided with a holding unit 31, a support unit 32, and a driving unit 33. The holding unit 31 holds the wafer W horizontally. The support unit 32 is a vertically extending member, and has a base end portion supported rotatably by the driving unit 33 and a tip end portion supporting the holding unit 31 horizontally. The driving unit 33 rotates the support unit 32 around the vertical axis. The substrate holding mechanism 30 rotates the support unit 32 by using the driving unit 33, so that the holding unit 31 supported by the support unit 32 is rotated, and hence, the wafer W held in the holding unit 31 is rotated.

The processing fluid supply unit 40 supplies a processing fluid onto the wafer W. The processing fluid supply unit 40 is connected to a processing fluid supply source 70.

The recovery cup 50 is disposed to surround the holding unit 31, and collects the processing liquid scattered from the wafer W by the rotation of the holding unit 31. A drain port 51 is formed on the bottom of the recovery cup 50, and the processing liquid collected by the recovery cup 50 is discharged from the drain port 51 to the outside of the processing unit 16. Further, an exhaust port 52 is formed on the bottom of the recovery cup 50 to discharge a gas supplied from the FFU 21 to the outside.

First Exemplary Embodiment

Next, a first exemplary embodiment of the wet etching method performed using the substrate processing system 1 will be described. First, descriptions will be made on the configuration of the processing unit 16 (16A) adapted to the implementation of the first exemplary embodiment of the wet etching method with reference to FIG. 3.

Figure 3:
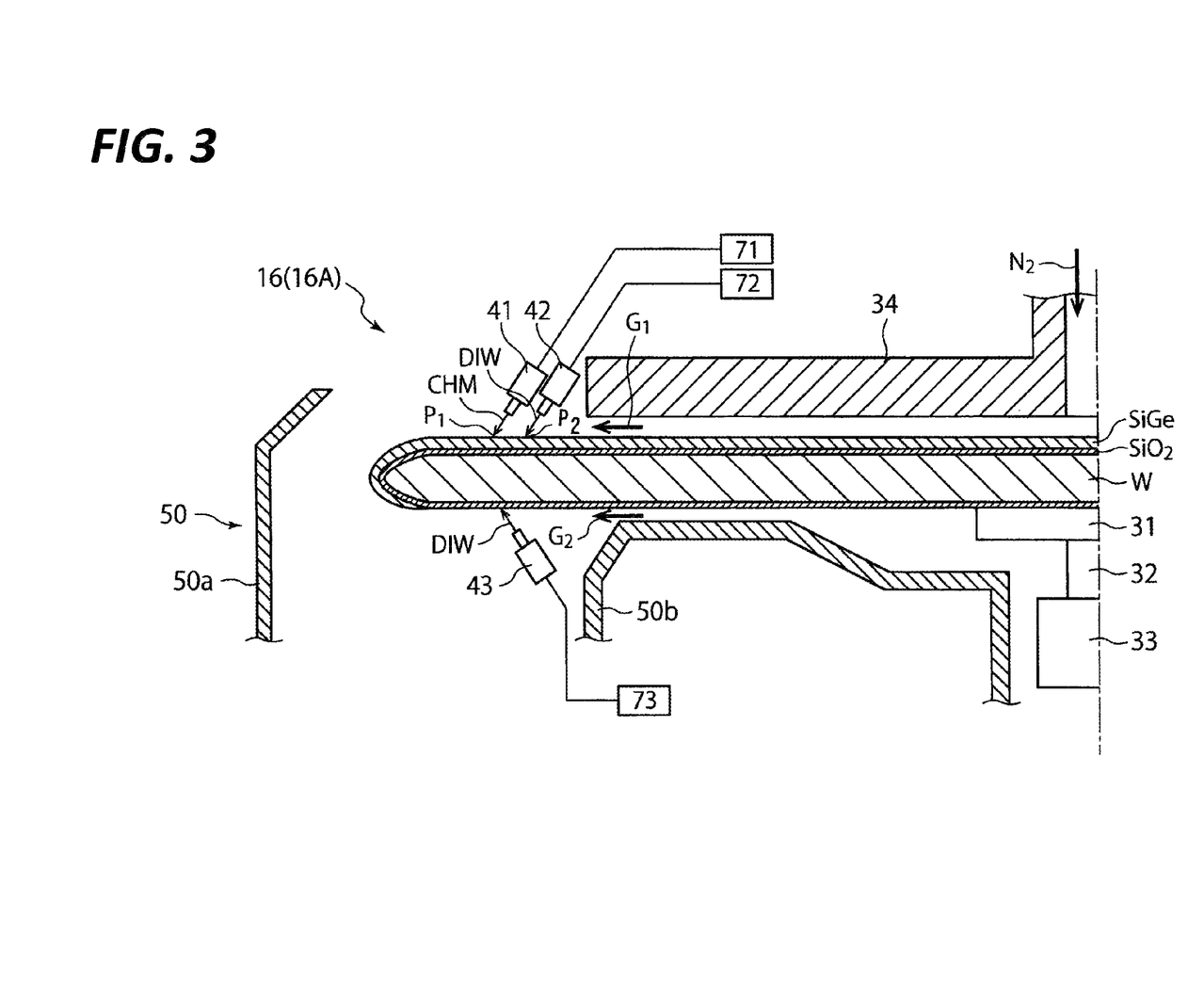
FIG. 3 is a vertical cross-sectional view illustrating an outline of a processing unit used in first and second exemplary embodiments of a wet etching method.

The processing unit 16A includes a chemical liquid nozzle 41, a rinse nozzle 42, and an etching inhibiting liquid nozzle 43 as components of the processing fluid supply unit 40 (see FIG. 2). The chemical liquid nozzle 41 supplies a chemical liquid such as, for example, dilute hydrofluoric acid (DHF) to the peripheral edge portion of the front surface (indicating the surface on which a device is formed) of the wafer W, including the bevel portion, that is, the position P1 which is the inner peripheral edge of a portion to be etched. The rinse nozzle 42 supplies deionized water (DIW) as a rinsing liquid to the position P2 located radially inward from the position P1 on the front surface of the wafer W to which the chemical liquid nozzle 41 supplies the chemical liquid. The etching inhibiting liquid nozzle 43 supplies an etching inhibiting liquid for lowering an etching rate to a position located inward from a position where an SiGe film may be formed, on the peripheral edge portion of the rear surface (indicating the surface on which no device is formed) of the wafer W. In the present exemplary embodiment, the etching inhibiting liquid is composed of DIW, and when the chemical liquid is diluted with the DIW, the etching rate is lowered. The etching inhibiting liquid is not limited to the DIW and may be any liquid as long as the liquid has an effect of lowering the etching rate by the chemical liquid to be supplied. When a liquid other than the DIW is used as an etching inhibiting liquid, the etching inhibiting liquid nozzle 43 is used to supply the liquid. Thus, in this case, a rinse nozzle is additionally provided to supply DIW as a rinsing liquid to the rear surface of the wafer W.

The chemical liquid, the rinsing liquid, and the etching inhibiting liquid may be supplied at controlled rates to the chemical liquid nozzle 41, the rinse nozzle 42, and the etching inhibiting liquid nozzle 43, respectively, through processing liquid supply mechanisms 71, 72, and 73, respectively, as components of the processing fluid supply source 70 (see FIG. 2). Each of the processing liquid supply mechanisms 71, 72, and 73 may include, for example, an opening/closing valve and a flow rate control valve that are interposed in each of processing liquid lines connecting the supply sources of the liquids and their corresponding nozzles 41, 42, and 43 to each other, respectively.

The processing unit 16 has a top plate 34 that covers the central upper side of the wafer W held by the holding unit 31. Nitrogen gas is supplied between the wafer W and the top plate 34 through a gas ejection port formed on the center portion of the top plate 34, and a flow G1 of the nitrogen gas suppresses splash of the chemical liquid and the rinsing liquid from adhering to the center portion of the front (upper) surface of the wafer W. In addition, the recovery cup 50 (schematically illustrated in FIG. 2) includes an outer cup body 50a and an inner cup body 50b. When the wafer W is rotated, a gas flow G2 is formed to flow outward from the space between the top surface of the inner cup body 50b and the rear (lower) surface of the wafer W, and as a result, splash of the etching inhibiting liquid is suppressed from adhering to the center portion of the rear surface of the wafer W.

The chemical liquid nozzle 41 and the rinse nozzle 42 may be fixed to the top plate 34 so as to move together with the top plate 34. The chemical liquid nozzle 41 and the rinse nozzle 42 are fixed to a nozzle arm (not illustrated), and may move between the processing position illustrated in FIG. 3 and a retreat position (not illustrated) outside the recovery cup 50. The etching inhibiting liquid nozzle 43 may be fixed to, for example, the inner cup body 50b. Alternatively, the etching inhibiting liquid nozzle 43 may be configured by a nozzle hole bored on the inner cup body 50b.

The holding unit 31 is configured by a vacuum chuck that vacuum-adsorbs the center portion of the rear surface of the wafer W.

Next, each process according to the first exemplary embodiment of the wet etching method will be described. Meanwhile, each process described below may be automatically performed under the control of the control device 4 by executing a control program stored in the storage unit 19 of the control device 4.

As illustrated in FIG. 3 and FIGS. 4A to 4D, the wafer W as a workpiece in the first exemplary embodiment is formed of a silicon substrate, and an $SiO_2$ film as a lower layer and an SiGe film as an upper layer are formed on the silicon substrate. The $SiO_2$ film is continuously formed over the entire front and rear surfaces of the wafer W. The SiGe film is formed over the entire front surface of the wafer W (the SiGe film is not formed on the rear surface). The SiGe film wraps around the bevel portion of the rear surface of the wafer W through the edge WE of the wafer W. In this specification, the edge WE of the wafer W indicates a circle passing the furthermost portion from the center of the wafer W.

As illustrated in FIG. 3, the wafer W is carried into the processing unit 16 and held in a horizontal posture on the holding unit 31. Then, the wafer W is rotated around the vertical axis. Next, as illustrated in FIGS. 4A to 4D, an etching chemical liquid (e.g., DHF) is supplied from the chemical liquid nozzle 41 to the peripheral edge portion of the front surface (the surface on which a device is formed) of the rotating wafer W that includes the bevel portion WB (indicating the outermost inclined peripheral portion of the wafer W; the edge surface P1 to WB may also be referred to as the bevel portion), that is, the position P1 which is the inner peripheral edge of the portion to be etched. This chemical liquid may etch both the $SiO_2$ film and the SiGe film (there is no large difference in etching rate). Meanwhile, in FIG. 3, FIGS. 4A to 4D, and FIG. 6, the chemical liquid is denoted by the reference symbol "CHM.".

The supplied chemical liquid flows along the front (upper) surface of the wafer W while spreading radially outward by the centrifugal force. While a part of the chemical liquid flowing on the bevel portion WB is separated and scattered from the wafer W by the centrifugal force, the other part of the chemical liquid wraps around the bevel portion of the rear surface of the wafer over the edge WE of the wafer W by the surface tension, and then, is separated and drops down from the wafer W by the gravity. Accordingly, the peripheral edge portion of the wafer W is in a state of being covered with the liquid film of the chemical liquid as illustrated in FIG. 4A. The SiGe film in contact with the chemical liquid is etched with elapse of time.

In the state of FIG. 4A, when some time elapses, the SiGe film on the bevel portion of the rear (lower) surface of the wafer W in which the film thickness is originally relatively thin, the edge WE of the wafer W, and the outermost peripheral portion of the bevel portion WB of the front (upper) surface of the wafer W is completely lost, and the $SiO_2$ film as a base is exposed. The SiGe film still remains in the region where the initial film thickness of the SiGe film is thick, that is, the region positioned radially inward from the bevel portion WB of the front surface of the wafer W and a part of the bevel portion WB. When the liquid supplying state illustrated in FIG. 4A is continued in order to completely remove the SiGe film remaining in the portion to be etched, etching of the already exposed $SiO_2$ film is proceeded with, and the $SiO_2$ film is lost so that Si as a base may be exposed.

Figure 4B:
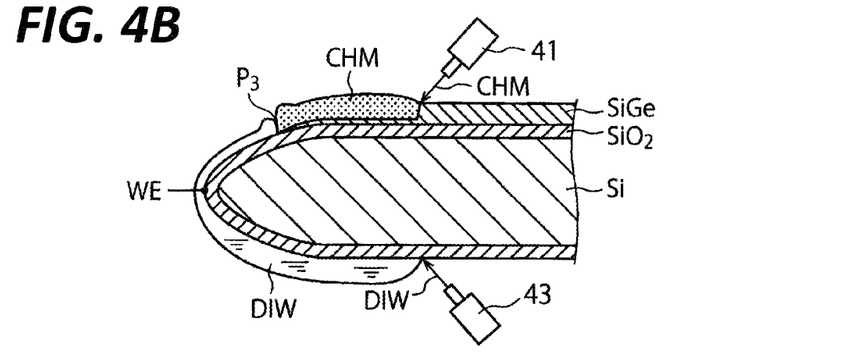
Figure 4C:
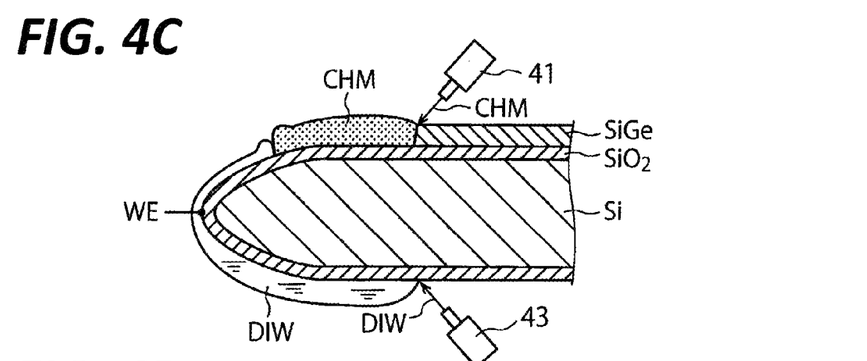

In order to prevent this occurrence, when the etching is proceeded with until the SiGe film reaches the state illustrated n FIG. 4B, DIW is supplied as an etching inhibiting liquid to the peripheral edge portion of the rear (lower) surface of the wafer W from the etching inhibiting liquid nozzle 43 while maintaining the ejection of the chemical liquid from the chemical solution nozzle 41. The DIW supplied from the etching inhibiting liquid nozzle 43 flows along the rear surface of the wafer W while spreading radially outward by the centrifugal force. While a part of the DIW flowing on the bevel portion WB of the rear surface is separated and scattered from the wafer W by the centrifugal force, the other part of the DIW wraps around the bevel portion WB of the front (upper) surface of the wafer W over the edge WE of the wafer W by the surface tension. During the flow, the DIW collides with the chemical liquid.

When the flow strength of the DIW is sufficiently larger than the flow strength of the chemical liquid, the flow of the DIW pushes the flow of the chemical liquid. In the present exemplary embodiment, as illustrated in FIG. 4B, it is assumed that the flow strength of the DIW is set such that a visible interface (a collision position) between the liquid film of the DIW and the liquid film of the chemical liquid occurs on the bevel portion WB of the front (upper) surface of the wafer W. Then, the remaining SiGe film is covered with the chemical liquid, and the exposed $SiO_2$ film is covered with the DIW. Thus, it is possible to reach the state where the etching rate of the $SiO_2$ film is largely lowered or the state where the etching of the $SiO_2$ film is substantially stopped, while further proceeding with the etching of the SiGe film.

The position of the visible interface (the first radial position P3 illustrated in FIG. 4B) between the liquid film of the DIW and the liquid film of the chemical liquid may be adjusted by changing parameters such as, for example, the supply flow rate of the DIW as an etching inhibiting liquid, the supply flow rate of the chemical liquid, and the rotation speed of the wafer W. A parameter value for setting the position of the interface to a desired position may be obtained by experiments. For example, when the supply flow rate of the DIW is set to be larger than the supply flow rate of the chemical liquid, the DIW may wraps around and reaches the first radial position P3 illustrated in FIG. 4B.

Meanwhile, FIGS. 4A to 4D are merely schematic views, and the clear interface as illustrated in FIG. 4B does not exist between the liquid film of the DIW and the liquid film of the chemical liquid. Actually, a chemical liquid diluted with the DIW and thus having a low concentration exists in the region in the vicinity of the portion where the DIW and the chemical liquid collide with each other. The etching rate of the SiGe film by the chemical liquid diluted and thus having a low concentration is at least lower than the etching rate of the SiGe film by the chemical liquid ejected from the chemical liquid nozzle 41.

In the state of FIG. 4B, when some time elapses, the SiGe film present radially outward from the position P1 is completely removed.

Figure 4D:
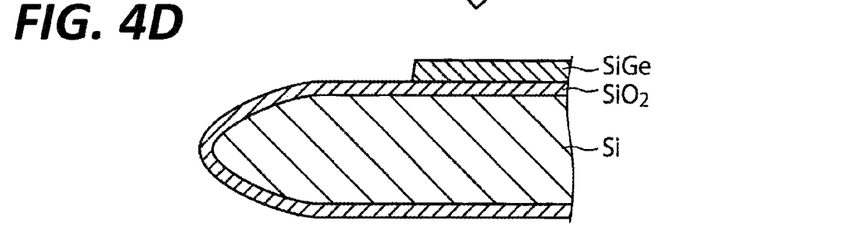

Then, the rinsing process of the wafer W is performed by stopping the ejection of the chemical liquid from the chemical liquid nozzle 41 and performing the ejection of the DIW from the rinse nozzle 42, while maintaining the ejection of the DIW from the etching inhibiting liquid nozzle 43. Then, the ejection of the DIW as a rinsing liquid from the rinse nozzle 42 and the etching inhibiting liquid nozzle 43 is stopped, and shake-off (spin) drying of the wafer W is performed while maintaining the rotation of the wafer W (preferably, increasing the number of the rotations of the wafer W). Thus, a series of etching processes are ended. FIG. 4D illustrates the state of the wafer W at this time. Here, the desired etching result in which the SiGe film on the peripheral edge portion of the front surface of the wafer W and the SiGe film on the rear surface of the wafer are completely removed, and the $SiO_2$ film remains on the entire front and rear surfaces of the wafer is obtained.

According to the above-described exemplary embodiment, by supplying the chemical liquid to the rotating water W and simultaneously supplying the etching inhibiting liquid to the wafer W, the etching rate of the film to be etched in a certain region (the second region) on the wafer W maintains high, and in this state, the etching rate of the film to be etched in another specific region (the first region) on the wafer W may be largely reduced or made substantially zero. Thus, the etching of the film to be etched that has an ununiform film thickness distribution (the SiGe film of the present exemplary embodiment), that is, the film that becomes thin as wrapping around the bevel portion of the rear surface of the wafer W through the edge WE of the wafer W may be terminated at substantially the same timing at the respective portions of the film to be etched. Therefore, the base may be suppressed from being locally damaged by the chemical liquid after the loss of the film to be etched.

In addition, the chemical liquid is supplied to the front (upper) surface of the wafer W which is one surface of the wafer W, and the etching inhibiting liquid is supplied to the rear (lower) surface of the wafer W which is the other surface of the wafer W such that the etching inhibiting liquid wraps around the front surface of the wafer and collides (is mixed) with the chemical liquid. Even when the chemical liquid is ejected toward the first position on the front surface of the wafer W, and the etching inhibiting liquid is ejected to the second position (the position located radially outward from the first position) on the front surface of the wafer W, the region having a high etching rate and the region having a low etching rate may be formed as described above. However, when the first position and the second position are close to each other, a problem occurs in that liquid splash of the etching inhibiting liquid dropping on the liquid film of the chemical liquid easily occurs. However, as in the above-described exemplary embodiment, when the chemical liquid is supplied to one surface of the wafer W, and the etching inhibiting liquid is supplied to the other surface of the wafer W so as to cause the chemical liquid and the etching inhibiting liquid to collide with each other by the wrap-around of the liquid, the chemical liquid and the etching inhibiting liquid smoothly collide with each other. Thus, the liquid splash caused by the collision between the chemical liquid and the etching inhibiting liquid is minimized.

In addition, according to the above-described exemplary embodiment, since the chemical liquid is supplied to one surface of the wafer W, and the etching inhibiting liquid is supplied to the other surface of the wafer W so as to cause the chemical liquid and the etching inhibiting liquid to collide with each other by the wraparound of the liquid, the position of the collision point (the position P3) between the chemical liquid and the etching inhibiting liquid may be adjusted only by adjusting the ejection flow rate of the chemical liquid and the ejection flow rate of the etching inhibiting liquid in association with the rotation speed of the wafer W. Thus, the position of the collision point between the chemical liquid and the etching inhibiting liquid may be adjusted without providing a mechanism for finely adjusting the ejection position of the etching inhibiting liquid, and the configuration of the apparatus may be suppressed from being complicated. Meanwhile, in the method of supplying both the chemical liquid and the etching inhibiting liquid to one surface of the wafer, the position of the collision point between the chemical liquid and the etching inhibiting liquid may not be adjusted unless the position of the etching inhibiting liquid nozzle is adjusted.

Second Exemplary Embodiment

Next, a second exemplary embodiment of the wet etching method executed using the substrate processing system 1 will be described. In the second exemplary embodiment, a processing unit 16B is used, in addition to the processing unit 16A used in the above-described first exemplary embodiment. Specifically, for example, the half of the processing units 16 of the substrate processing system 1 may be used as the processing unit 16A, and the remaining half thereof may be used as the processing unit 16B.

Hereinafter, the configuration of the processing unit 16B will be described with reference to FIG. 5. The processing unit 16B includes a base plate 311 and a grasping claw 312 attached to the base plate 311, as the holding unit 31 (indicated as "31'" for discrimination) illustrated in FIG. 2. The grasping claw 312 may swing to grasp and release the wafer W. A processing liquid supply pipe 44 as a component of the processing fluid supply unit 40 (see FIG. 2) is inserted into a support unit 32' extending downward from the base plate 311. The top end portion of the processing liquid supply pipe 44 is configured by a processing liquid nozzle 45. The processing liquid nozzle 45 is positioned directly under the center of the rear (lower) surface of the wafer W.

The processing unit 16B has a rinse nozzle 46 that supplies a rinsing liquid to the front (upper) surface of the substrate. The rinse nozzle 46 is movable between the processing position directly above the center of the front (upper) surface of the wafer W and the retreat position retreated from the recovery cup 50, through a nozzle moving mechanism (not illustrated).

A chemical liquid (e.g., DHF) or a rinsing liquid (e.g., DIW) may be selectively supplied to the processing liquid nozzle 45 at a controlled flow rate through a processing liquid supply mechanism (a chemical liquid supply mechanism) 75A or a processing liquid supply mechanism (a rinsing liquid supply mechanism) 75B as a component of the processing fluid supply source 70 (see FIG. 2). A rinsing liquid (e.g., DIW) may be supplied to the rinse nozzle 46 at a controlled flow rate through a processing liquid supply mechanism 76 as a component of the processing fluid supply source 70. Each of the processing liquid supply mechanisms 75A, 75B, and 76 may include, for example, an opening/closing valve and a flow rate control valve that are interposed in each of processing liquid lines connecting the supply sources of the respective liquids and their corresponding nozzles 45 and 46 to each other, respectively.

Next, each process according to the second exemplary embodiment of the wet etching method will be described. Meanwhile, each process described below may also be automatically performed under the control of the control device 4 by executing a control program stored in the storage unit 19 of the control device 4.

As illustrated in FIGS. 6A to 6D, the wafer W as a workpiece in the second exemplary embodiment is formed of a silicon substrate, and an $SiO_2$ film as a lower layer and a poly-Si (polysilicon) film as an upper layer are formed on the silicon substrate. The $SiO_2$ film is formed by a batch type oxidation apparatus and continuously formed over the entire regions of the front surface (the surface on which a device is formed) and the rear surface (the surface on which no device is formed) of the wafer W. The poly-Si film is formed by a batch type decompression CVD apparatus and continuously formed over the entire front and rear surfaces of the wafer W.

As illustrated in FIG. 3, the wafer W is carried into the processing unit 16A and held in the horizontal posture on the holding unit 31. Then, the wafer W is rotated. Next, the similar state to that of FIG. 4B in the above-described first exemplary embodiment is set. That is, as illustrated in FIG. 6A, a chemical liquid (e.g., DHF) is supplied to the position P1 from the chemical liquid nozzle 41, and DIW as an etching inhibiting liquid is supplied to the peripheral edge portion of the rear (lower) surface of the wafer W from the etching inhibiting liquid nozzle 43. Then, only the range from the position where the DIW and the chemical liquid collide with each other to the position P1 is covered with the thick chemical liquid. Thus, the poly-Si film in this range is etched and removed so as to be in the state illustrated in FIG. 6B.

Then, the rinsing process of the wafer W is performed by stopping the ejection of the chemical liquid from the chemical liquid nozzle 41, and performing the ejection of the DIW from the rinse nozzle 42, while maintaining the ejection of the DIW from the etching inhibiting liquid nozzle 43. Then, the ejection of the DIW as a rinsing liquid from the rinse nozzle 42 and the etching inhibiting liquid nozzle 43 is stopped, and shake-off (spin) drying of the wafer W is performed while maintaining the rotation of the wafer W (preferably, increasing the number of the rotations of the wafer W).

Figure 5:
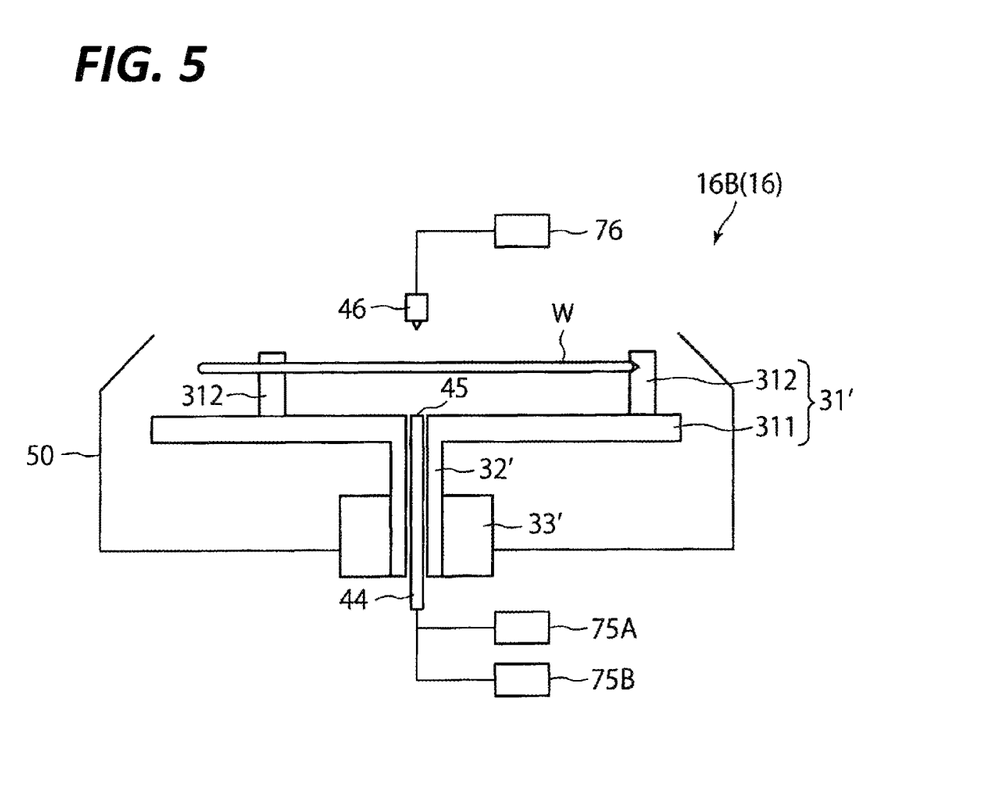
FIG. 5 is a vertical cross-sectional view illustrating an outline of a processing unit used in the second exemplary embodiment of the wet etching method.

Then, the wafer W is carried out of the processing unit 16A and carried into the processing unit 16B so as to be held horizontally by the holding unit 31' as illustrated in FIG. 5. Subsequently, a driving unit 33' is operated such that the wafer W is rotated around the vertical axis.

In this state, the chemical liquid (e.g., DHF) is ejected from the processing liquid nozzle 45 toward the center portion of the rear surface of the wafer W. The chemical liquid flows along the rear (lower) surface of the wafer W while spreading radially outward by the centrifugal force. While the chemical liquid flowing on the bevel portion of the rear surface is separated and scattered from the wafer W by the centrifugal force, a part of the chemical liquid wraps around the bevel portion of the front (upper) surface of the wafer W over the edge WE of the wafer W (see FIG. 6C). The poly-Si film in contact with the chemical liquid is further etched with elapse of time and finally lost as illustrated in FIG. 6D.

Figure 6D:
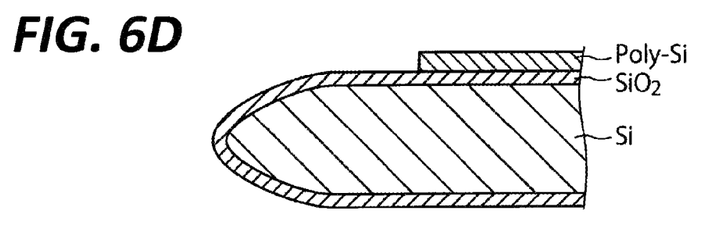

When the etching is proceeded with and reaches the state illustrated in FIG. 6D, the rinsing process of the wafer W is performed by stopping the ejection of the chemical liquid from the processing liquid nozzle 45, ejecting DIW as a rinsing liquid from the processing liquid nozzle 45, and ejecting DIW as a rinsing liquid to the center portion of the front (upper) surface of the wafer W from the rinse nozzle 46. Then, the ejection of the DIW from the processing liquid nozzle 45 and the rinse nozzle 46 is stopped, and shake-off (spin) drying of the wafer W is performed, while maintaining the rotation of the wafer W (preferably, increasing the number of the rotations of the wafer W). Thus, a series of etching processes are ended.

In the second exemplary embodiment as well, the desired etching result in which the poly-Si film on the peripheral edge portion of the front surface of the wafer W and the poly-Si film on the rear surface of the wafer are completely removed, and the $SiO_2$ film remains on the entire front and rear surfaces of the wafer is obtained.

The film to be etched is not limited to the film described above, and may be any type of a laminated film of two (or more) layers having no large difference in etching rate by an etching chemical liquid.

The substrate to be etched by the above-described exemplary embodiments is not limited to the semiconductor wafer W, and may be any substrate such as, for example, a glass substrate or a ceramic substrate.

The invention claimed is:

1. A wet etching method for wet-etching a substrate including a first surface and a second surface opposite to the first surface and formed with a first layer as a lower layer and a second layer as an upper layer that are laminated on at least a peripheral edge portion of the first surface of the substrate, the method comprising:
   a process of rotating the substrate;
   a process of supplying a chemical liquid capable of etching both the first layer and the second layer, to the first surface of the rotating substrate; and
   a first process of supplying an etching inhibiting liquid to the second surface of the substrate while supplying the chemical liquid to the substrate;
   wherein in the first process, the etching inhibiting liquid is supplied while rotating the substrate such that the etching inhibiting liquid wraps around the first surface through an edge of the substrate and reaches a first region extending from the edge of the substrate on the peripheral edge portion of the first surface to a first radial position located radially inward from the edge on the first surface.

2. The wet etching method of claim 1, wherein the process of supplying the etching inhibiting liquid to the second surface of the substrate is started after the chemical liquid is supplied to the first surface of the substrate for predetermined time, or after the second layer is etched to a predetermined extent by the chemical liquid.

3. The wet etching method of claim 2, wherein when a front surface of the substrate is covered by a liquid film of the etching inhibiting liquid or the chemical liquid is diluted with the etching inhibiting liquid, etching by the chemical liquid is prevented or suppressed.

4. The wet etching method of claim 2, wherein the etching inhibiting liquid prevents or suppresses the second layer exposed as a result of removal of the first layer from being etched by the chemical liquid.

5. The wet etching method of claim 1, further comprising:
   a second process,
   wherein in the first process, the chemical liquid is supplied such that the second layer in a second region of the peripheral edge portion of the first surface that is located radially inward from the first region is etched in a state where the etching inhibiting liquid reaches the first region, and
   the second process includes supplying the chemical liquid to the second surface of the substrate such that the chemical liquid wraps around the first surface through the edge of the substrate, and as a result, the second layer on the second surface and the second layer in the first region of the first surface are etched at the same time.

6. The wet etching method of claim 5, wherein the surface of the substrate is covered by the liquid film of the etching inhibiting liquid or the chemical liquid is diluted with the etching inhibiting liquid, and as a result, the etching by the chemical liquid is prevented or suppressed.

7. The wet etching method of claim 1, wherein the first surface of the substrate is covered by a liquid film of the etching inhibiting liquid or the chemical liquid is diluted with the etching inhibiting liquid, and as a result, the etching by the chemical liquid is prevented or suppressed.

8. The wet etching method of claim 1, wherein the etching inhibiting liquid is deionized water.

* * * * *